(12) United States Patent
Chen et al.

(10) Patent No.: US 11,075,182 B2
(45) Date of Patent: Jul. 27, 2021

(54) SEMICONDUCTOR PACKAGE AND METHOD OF FORMING THE SAME

(71) Applicant: Taiwan Semiconductor Manufacturing Company Limited, Hsinchu (TW)

(72) Inventors: Hsien-Wei Chen, Hsinchu (TW); An-Jhih Su, Taoyuan County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/142,173

(22) Filed: Sep. 26, 2018

(65) Prior Publication Data

US 2019/0027456 A1 Jan. 24, 2019

Related U.S. Application Data

(62) Division of application No. 15/355,145, filed on Nov. 18, 2016, now Pat. No. 10,096,563, which is a
(Continued)

(51) Int. Cl.
*H01L 23/48* (2006.01)
*H01L 23/00* (2006.01)
(Continued)

(52) U.S. Cl.
CPC ............ *H01L 24/17* (2013.01); *H01L 21/568* (2013.01); *H01L 23/49816* (2013.01);
(Continued)

(58) Field of Classification Search
CPC ....... H01L 2924/00014; H01L 2924/00; H01L 2224/73265; H01L 2224/48227; H01L 2924/00012; H01L 2224/32225; H01L 2924/181; H01L 2924/15311; H01L 2924/014; H01L 2224/13111;
(Continued)

(56) References Cited

U.S. PATENT DOCUMENTS

| 8,119,921 B1 | 2/2012 | Goergen et al. |
| 2002/0081772 A1* | 6/2002 | Madrid .................. H01L 24/81 438/108 |

(Continued)

FOREIGN PATENT DOCUMENTS

CN 102420180 4/2012

OTHER PUBLICATIONS

Chinese Office Action; Application No. 201510514578.3; dated Jul. 27, 2017.

*Primary Examiner* — Robert G Bancher
(74) *Attorney, Agent, or Firm* — Jones Day

(57) ABSTRACT

A method of forming a semiconductor package includes receiving a carrier, coating the carrier with a bonding layer, forming a first insulator layer over the bonding layer, forming a backside redistribution layer over the first insulator layer, forming a second insulator layer over the backside redistribution layer, patterning the second insulator layer to form a recess that extends through the second insulator layer and to the backside redistribution layer, filling the recess with a solder, and coupling a surface-mount device (SMD) to the solder.

20 Claims, 25 Drawing Sheets

Related U.S. Application Data division of application No. 14/470,999, filed on Aug. 28, 2014, now Pat. No. 9,502,364.

(51) Int. Cl.
| | |
|---|---|
| *H01L 21/56* | (2006.01) |
| *H01L 25/10* | (2006.01) |
| *H01L 23/498* | (2006.01) |
| *H01L 25/18* | (2006.01) |
| *H01L 25/065* | (2006.01) |

(52) U.S. Cl.
CPC ........ *H01L 23/49838* (2013.01); *H01L 24/03* (2013.01); *H01L 24/05* (2013.01); *H01L 24/19* (2013.01); *H01L 24/20* (2013.01); *H01L 24/81* (2013.01); *H01L 24/97* (2013.01); *H01L 25/105* (2013.01); *H01L 25/18* (2013.01); *H01L 24/16* (2013.01); *H01L 24/32* (2013.01); *H01L 24/48* (2013.01); *H01L 24/73* (2013.01); *H01L 24/83* (2013.01); *H01L 24/92* (2013.01); *H01L 25/0657* (2013.01); *H01L 2224/02335* (2013.01); *H01L 2224/0401* (2013.01); *H01L 2224/04042* (2013.01); *H01L 2224/04105* (2013.01); *H01L 2224/05011* (2013.01); *H01L 2224/12105* (2013.01); *H01L 2224/16227* (2013.01); *H01L 2224/17181* (2013.01); *H01L 2224/19* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/83005* (2013.01); *H01L 2224/92244* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2225/1088* (2013.01); *H01L 2924/00* (2013.01); *H01L 2924/00014* (2013.01); *H01L 2924/1032* (2013.01); *H01L 2924/10253* (2013.01); *H01L 2924/1461* (2013.01); *H01L 2924/15311* (2013.01); *H01L 2924/181* (2013.01); *H01L 2924/182* (2013.01); *H01L 2924/19041* (2013.01); *H01L 2924/19042* (2013.01); *H01L 2924/19043* (2013.01); *H01L 2924/19105* (2013.01)

(58) Field of Classification Search
CPC ....... H01L 2224/05647; H01L 2224/97; H01L 2224/16225; H01L 2224/13147; H01L 2224/0239; H01L 2224/48091; H01L 2924/01029; H01L 2224/73204; H05K 1/111; H05K 1/181; H05K 1/0284; H05K 1/0313; H05K 2201/09409; H05K 3/40; H05K 1/0206; H05K 1/0295; H05K 1/0306; H05K 1/113; H05K 1/185; H05K 2201/068; H05K 2201/09954; H05K 2201/10674; H05K 3/341; H05K 3/46; G06F 1/1681; G06F 1/1616; G06F 1/1622; E05D 3/06; H01R 39/64; Y10T 29/4902

See application file for complete search history.

(56) References Cited

U.S. PATENT DOCUMENTS

| | | | |
|---|---|---|---|
| 2005/0012208 | A1 | 1/2005 | Jang et al. |
| 2006/0017141 | A1* | 1/2006 | Luo ........................ H01L 23/492 257/666 |
| 2007/0096249 | A1* | 5/2007 | Roeper ................. H01L 23/147 257/528 |
| 2009/0008762 | A1* | 1/2009 | Jung ................... H01L 23/5389 257/686 |
| 2009/0263983 | A1 | 10/2009 | Liao |
| 2009/0294930 | A1 | 12/2009 | Yoon et al. |
| 2011/0278054 | A1 | 11/2011 | Lee et al. |
| 2011/0291283 | A1* | 12/2011 | Chi ..................... H01L 23/3128 257/773 |
| 2013/0178016 | A1 | 7/2013 | Yim et al. |
| 2013/0335933 | A1* | 12/2013 | Ishii ..................... H05K 3/3442 361/752 |
| 2015/0200188 | A1 | 7/2015 | Yu et al. |
| 2015/0279776 | A1 | 10/2015 | Hu et al. |
| 2015/0342045 | A1* | 11/2015 | Nakabayashi ......... H05K 1/111 362/611 |
| 2016/0029485 | A1 | 1/2016 | Dummer |

* cited by examiner

1800

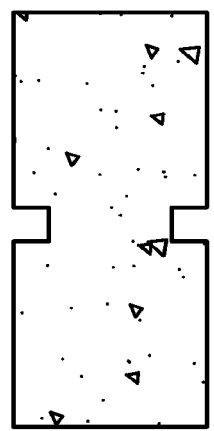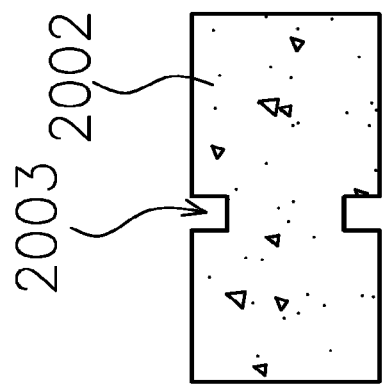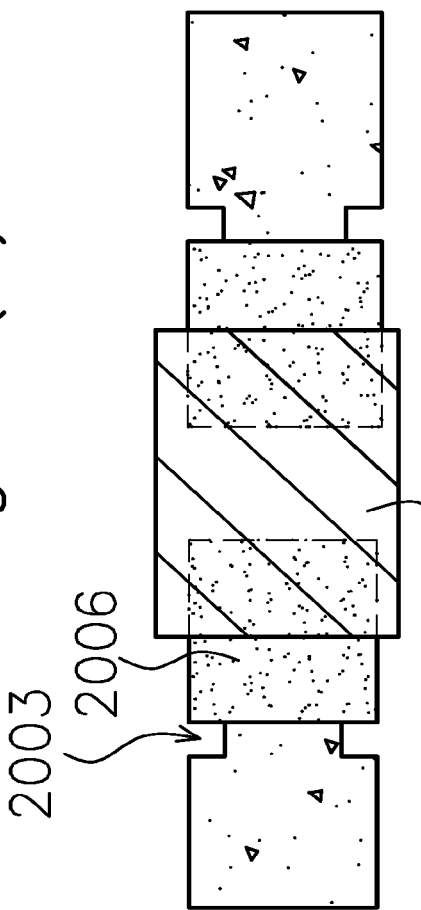

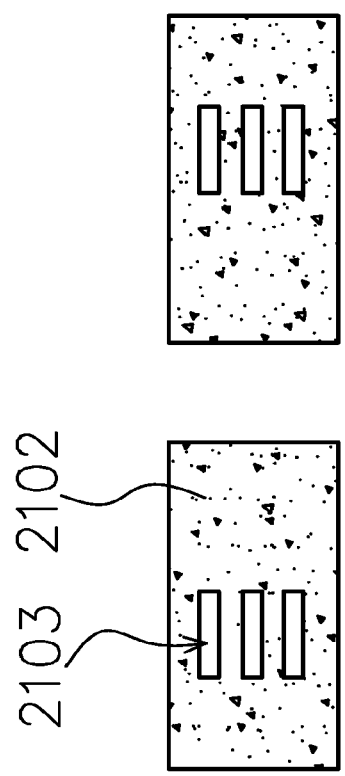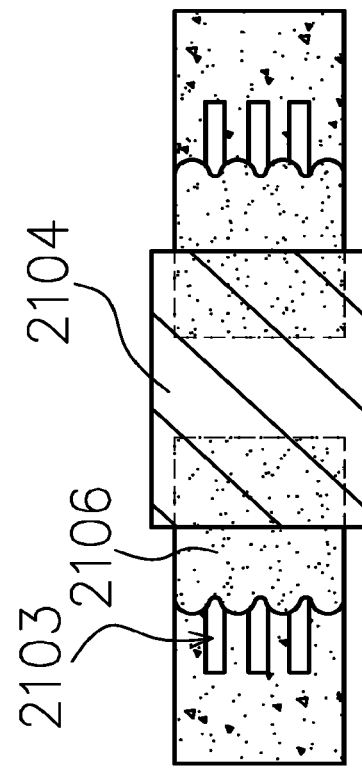

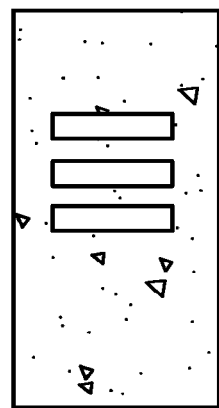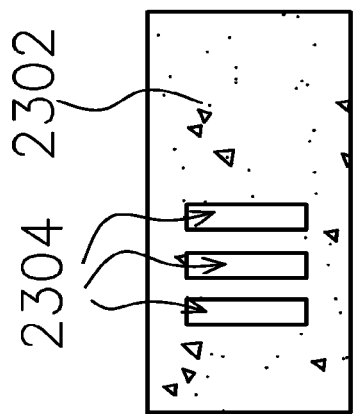
Fig. 23
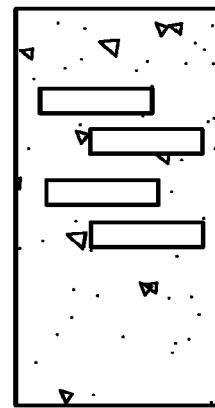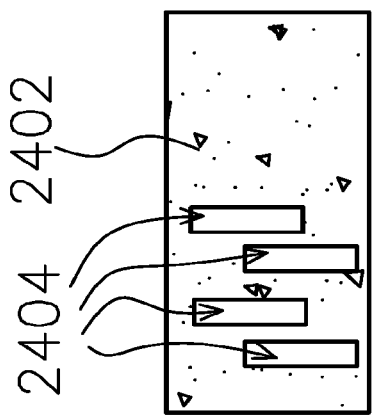
Fig. 24

SEMICONDUCTOR PACKAGE AND METHOD OF FORMING THE SAME

CROSS-REFERENCE TO A RELATED APPLICATION

The present application is a divisional of U.S. patent application Ser. No. 15/355,145, filed Nov. 18, 2016, which is a divisional of U.S. patent application Ser. No. 14/470,999, filed Aug. 28, 2014, the contents of which are incorporated herein by reference in their entirety.

BACKGROUND

For mobile applications, a form factor refers to a mobile device's size, shape, and style, as well as the layout and position of the components. Consumers prefer devices with a thinner form factor, making manufacture of the device more difficult. Therefore, there is a need to meet the above demand.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 is a sectional view illustrating an exemplary semiconductor package in accordance with some embodiments.

FIGS. 20(a), 20(b) are top views illustrating the shape of the pad in the backside redistribution layer of the exemplary semiconductor package and its contact with the SMD component by using solders in accordance with some embodiments.

FIGS. 21(a), 21(b) are top views illustrating the shape of the pad in the backside redistribution layer of the exemplary semiconductor package and its contact with the SMD component by using solders in accordance with some embodiments.

FIGS. 23, 24 are top views illustrating the shape of the pad in the backside redistribution layer of the exemplary semiconductor package in accordance with some embodiments.

DETAILED DESCRIPTION

Figure 1:
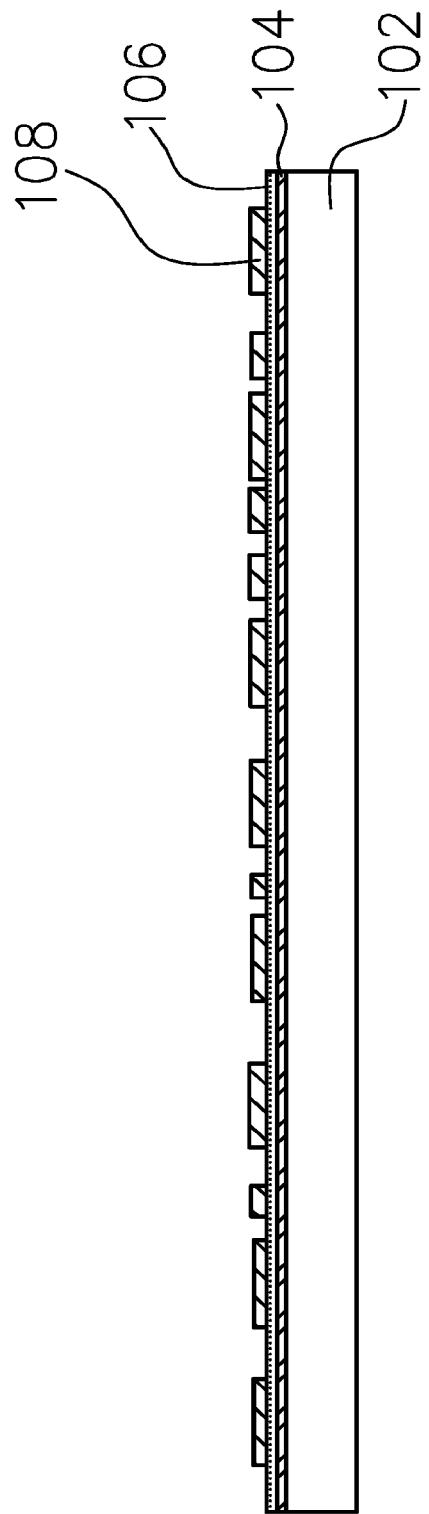
FIG. 1 is a sectional view illustrating an exemplary semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For mobile application, a form factor refers to a mobile device's size, shape, and style, as well as the layout and position of the components, such as embedded SMD components and chips. Consumers prefer devices with a thinner form factor, which makes manufacture of the devices more difficult.

In order to reach the thinner package form factor without sacrificing signal integrity, the SMD components may be placed between the substrate (e.g., PCB) and the chips, and by the side of ball grid array ("BGA") balls. The distance therebetween is determined by the BGA balls. The SMD components should have a height which is less than a stand-off height of the BGA balls. In one embodiment, the height of the SMD components is about 130-150 micrometers; the height of the pre-solder is about 20 micrometers; and the stand-off-height of the BGA balls is about 140-170 micrometers. It has been demonstrated that the design margin for the placement of the SMD components is very tight. Therefore, to enlarge the design margin, this disclosure embeds the SMD in the molding.

In one embodiment, a new package structure is disclosed. Some pads of a backside redistribution layer (B/S RDL) in the package are designed with an open structure. By using the open structure, the molding material can flow into the space under the SMD component.

The chip may be selected from the group consisting of silicon semiconductors or III-V semiconductors. The chips may include a microelectromechanical system (MEMS).

FIG. 1 is a sectional view illustrating an exemplary semiconductor package in accordance with some embodiments. As shown in FIG. 1, a temporary bonding layer 104 is coated over a carrier 102. The carrier 102 may be formed of, for example, metal or glass. The temporary bonding layer 104 is formed of, for example, glue.

An insulator layer 106 is formed over the temporary bonding layer 104. The insulator layer 106 may be formed of, for example, epoxy or polymer. A backside redistribution layer 108 is formed over the insulator layer 106, then, the backside redistribution layer 108 is patterned by using a mask (not shown). The material for the backside redistribution layer 108 may include, but is not limited to, for example, Cu, Al, AlCu, Al alloy, Cu alloy, or other conductive materials.

Figure 2:
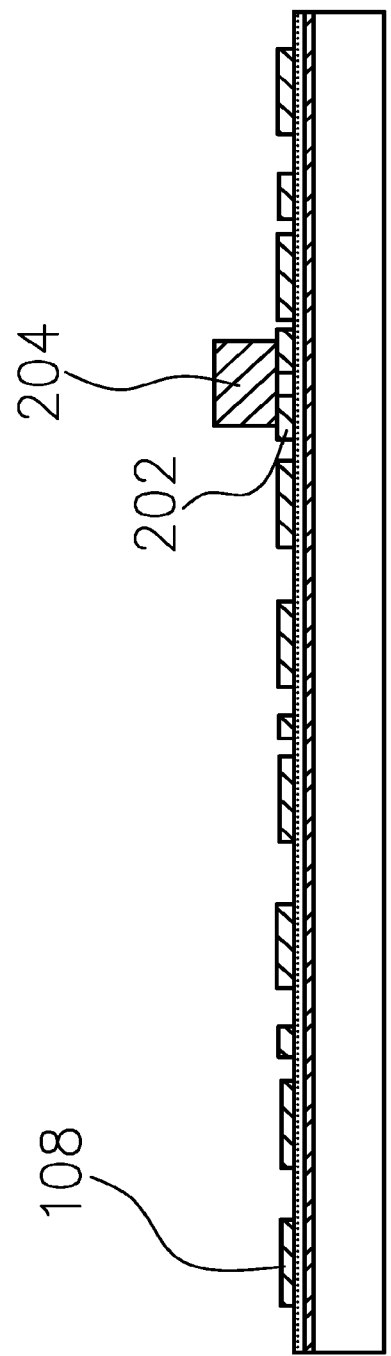
FIGS. 2-10 are sectional views illustrating the exemplary semiconductor package in accordance with some embodiments.

FIG. 2 is a sectional view illustrating the exemplary semiconductor package in accordance with some embodiments. As shown in FIG. 2, a pre-solder (not shown) is provided over a portion 202 of the backside redistribution layer 108. An SMD component 204 is provided over the backside redistribution layer 108. The pre-solder (not shown) is disposed between the SMD component 204 and the portion 202 of the backside redistribution layer 108. The SMD component 204 may be, for example, passive components, such as resistor, inductors, or capacitors.

Figure 3:
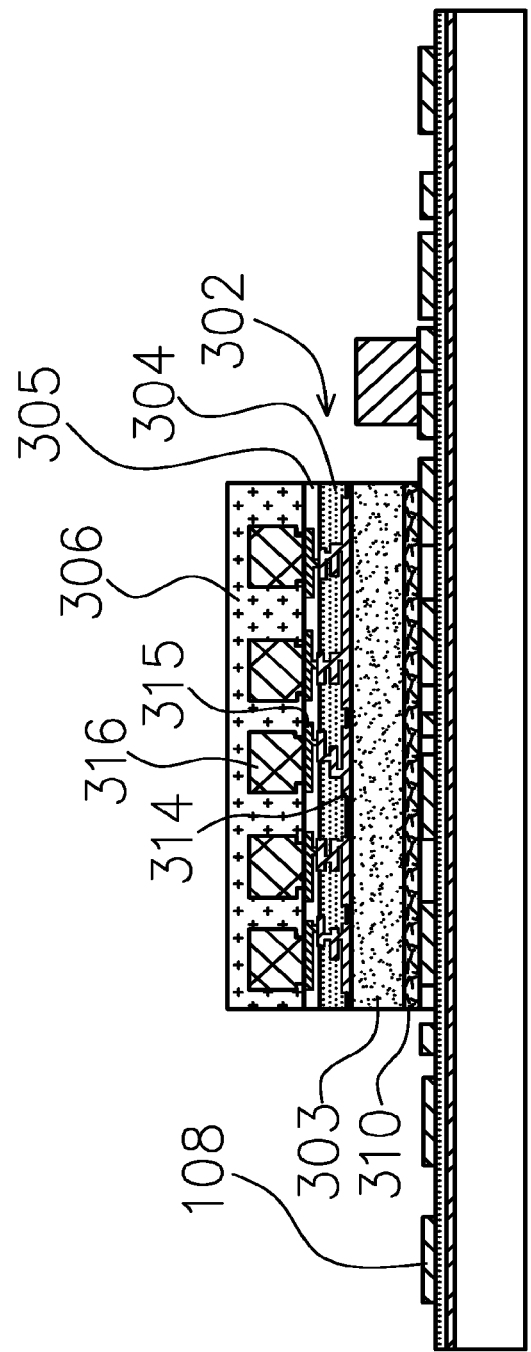
Figure 4:
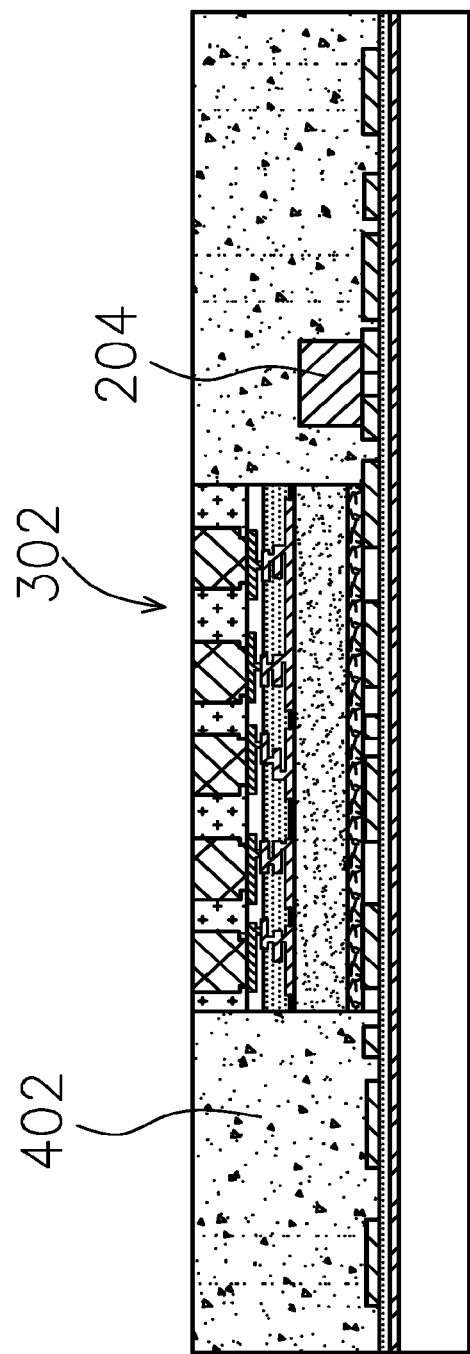

FIG. 3 is a sectional view illustrating the exemplary semiconductor package in accordance with some embodiments. As shown in FIG. 3, a chip 302 is provided over the backside redistribution layer 108. In details, the chip 302 adheres to the backside redistribution layer 108 by a glue layer 310. The chip 302 includes a die 303, an interconnect layer 304, a passivation layer 305, and a sacrificial layer 306. The interconnect layer 304 includes interconnections 314. The passivation layer 305 includes a pad 315. The sacrificial layer 306 includes a copper (Cu) pillar 316. The die 303 connects to the Cu pillar 316 through the interconnections 314 and the pad 315. The interconnect layer 304 may be made of low-k material. The sacrificial layer 306 may be made of polymer. In the embodiments, the chip 302 may be selected from the group consisting of silicon semiconductors or III-V semiconductors. The chips may include a microelectromechanical system (MEMS). FIG. 4 is a sectional view illustrating the exemplary semiconductor package in accordance with some embodiments. As shown in FIG. 4, a molding compound 402 is provided over the SMD component 204 and adjacent to the chip 302. The molding compound 402 may be made of silica, organic materials, or epoxy resins. The molding step may be performed to form the molding compound 402 surrounding the SMD component 204 and adjacent to the chip 302. The molding compound 402 may be partially removed from the top of the chip 302 to expose the upper surface of the chip 302.

Figure 5:
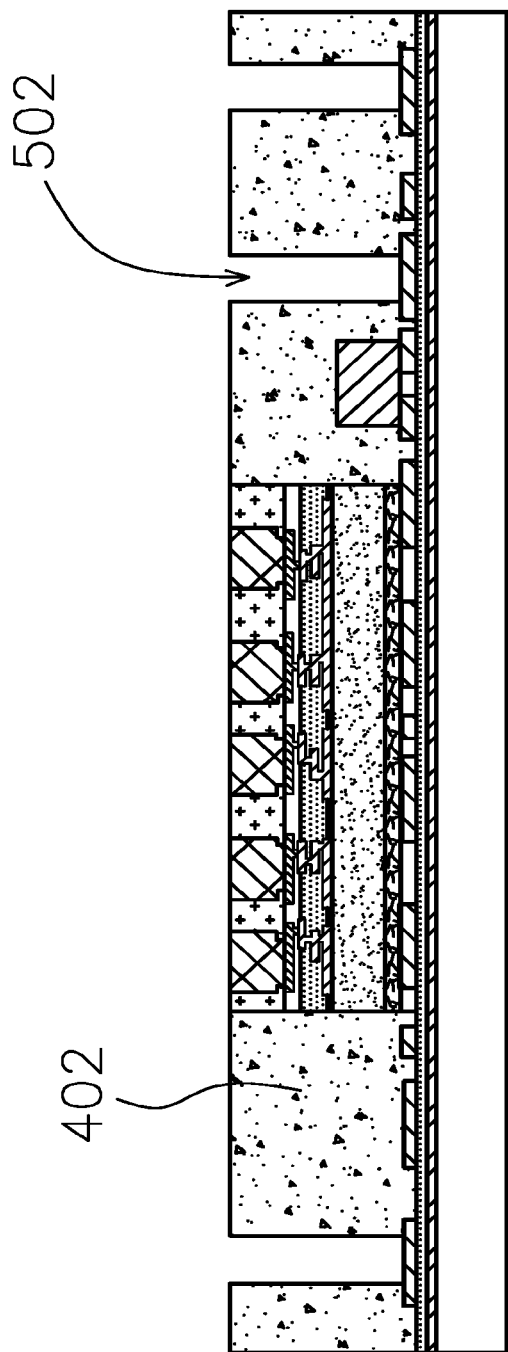

FIG. 5 is a sectional view illustrating the exemplary semiconductor package in accordance with some embodiments. As shown in FIG. 5, a via hole 502 is opened in the molding compound 402. In the embodiment, the via hole 502 exposes the backside redistribution layer 108.

Figure 6:
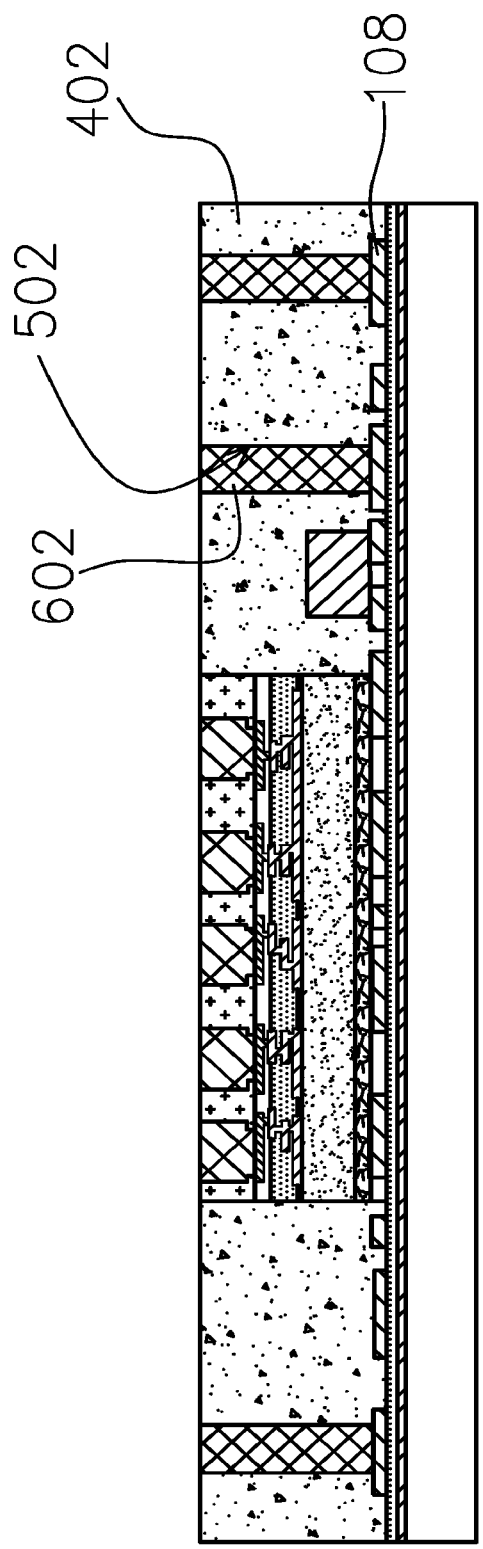

FIG. 6 is a sectional view illustrating the exemplary semiconductor package in accordance with some embodiments. As shown in FIG. 6, a via 602 is provided in the via hole 502 of the molding compound 402, and the via 602 electrically connects to the backside redistribution layer 108. The via 602 may be made of, for example, copper or tin. In the embodiment, the formation of the molding compound 402 and the via 602 includes: first forming the molding compound 402; opening the via hole 502 in the molding compound 402 to expose the backside redistribution layer 108; and then forming the via 602 in the via hole 502. In some embodiments, such formation may include: first forming the via 602; and then forming the molding compound 402. That is, the sequence of the formation of the molding compound 402 and the via 602 may alter.

Figure 7:
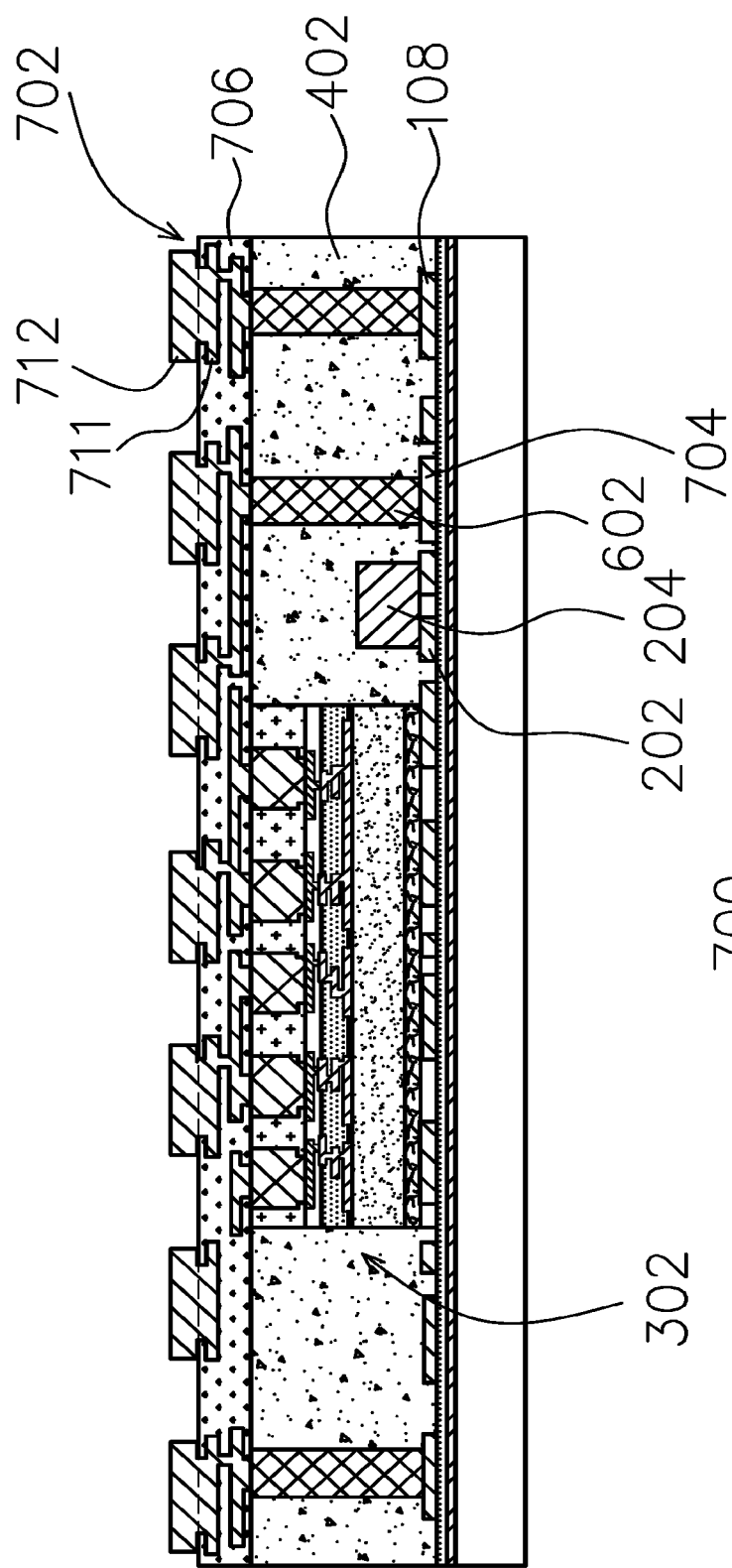

FIG. 7 is a sectional view illustrating the exemplary semiconductor package in accordance with some embodiments. As shown in FIG. 7, the portion 202 and the portion of 704 of the backside redistribution layer 108 are connected, then a front redistribution layer 702 is provided over the chip 302 and the via 602 to connect the chip 302 and the SMD component 204 by using the backside redistribution layer 108, the via 602, and the front redistribution layer 702. The front redistribution layer 702 surrounded by a polybenzoxazole (PBO) layer 706 may include a trace 711 and an under bump metal (UBM) 712. The end of the trace 711 may provide a landing pad (not shown).

The trace 711 and the PBO layer 706 can be either a single layer or stacked multiple layers. In the embodiment with the trace 711 and the PBO layer 706 having stacked multiple layers, the formation of the PBO layer 706 and the trace 711 may include: forming a first PBO layer over the chip 302 and the molding compound 402; etching the first PBO layer and forming a first trace layer in the etched portion; repeating the formation and the etching process; and forming the UBM 712 over the end of the trace 711 (landing pad). The material for the front redistribution layer 702 may comprise, but is not limited to, for example Cu, Al, AlCu, Al alloy, Cu alloy, or other conductive materials. As such, a semiconductor package 700 is provided. The SMD components 204 are placed in the molding compound 402 and are not placed between BGA balls. So the SMD components 204 are no longer constrained by a height which is less than the stand-off-height of the BGA balls. While having a thinner package form factor without sacrificing signal integrity, the design margin for placement of the SMD components 204 relaxes.

Figure 8:
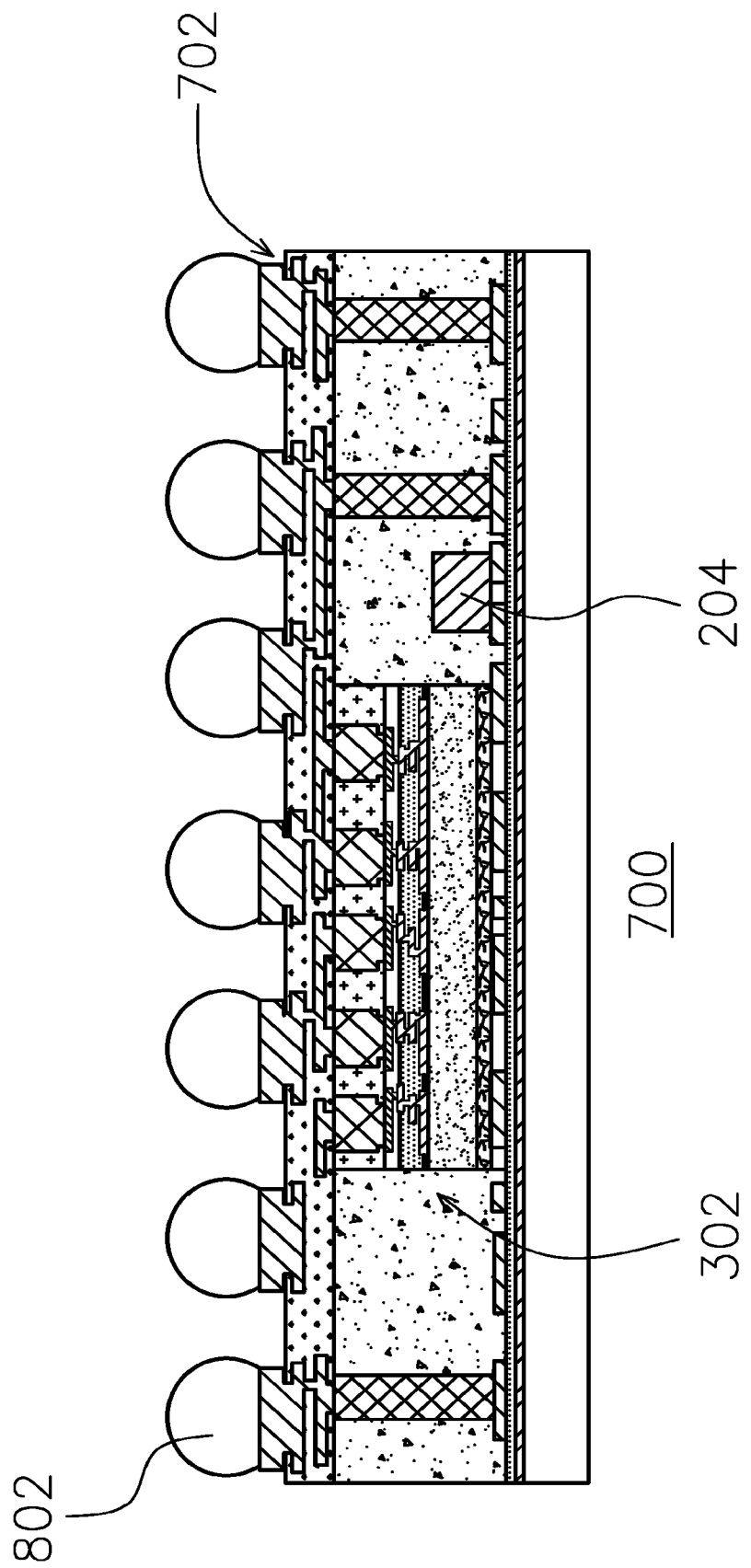
Figure 9:
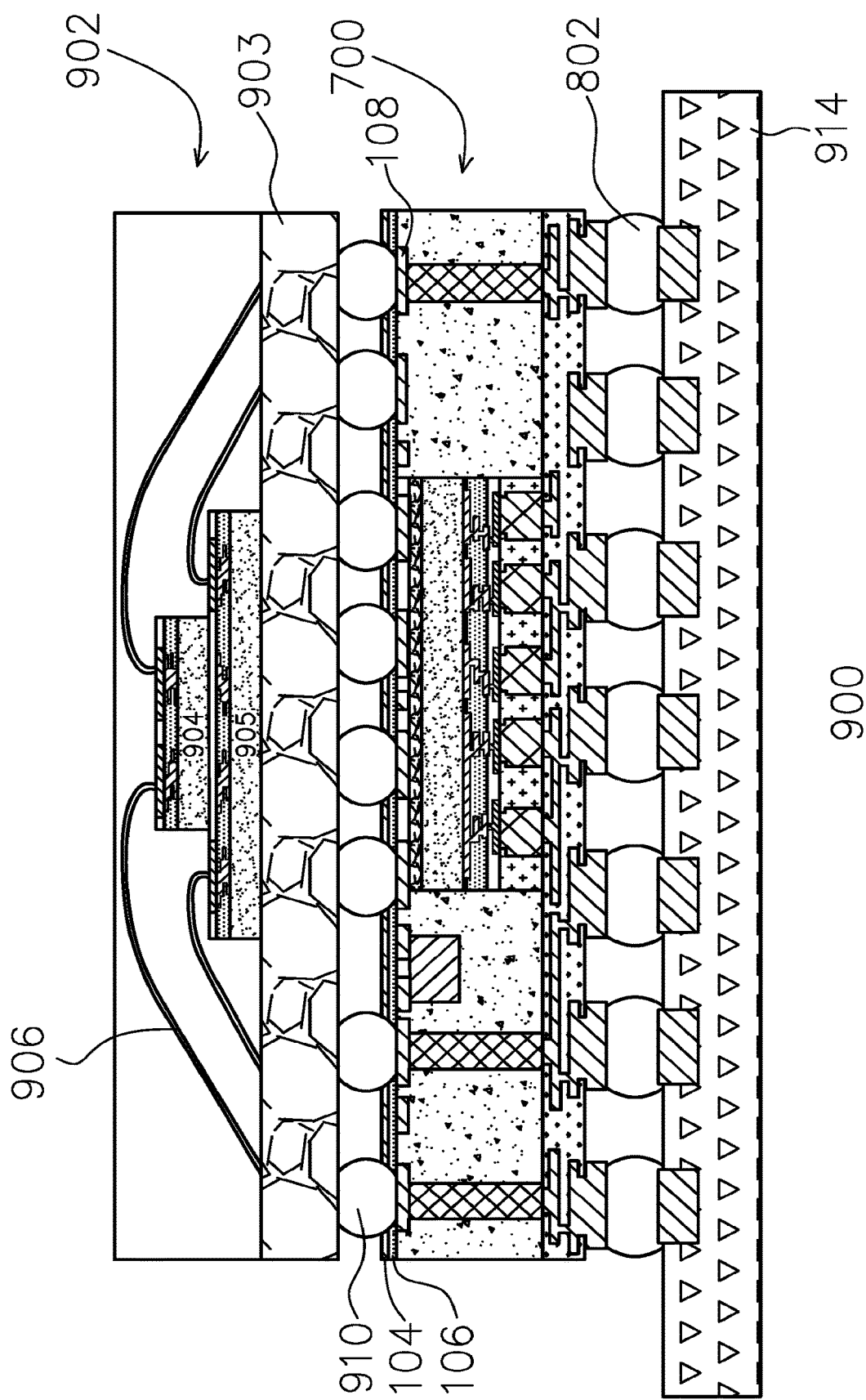

FIG. 8 is a sectional view illustrating the exemplary semiconductor package in accordance with some embodiments. As shown in FIG. 8, a plurality of metal bumps 802 are provided and connected to the chip 302 and the SMD component 204 by the front redistribution layer 702. The formation of the metal bumps 802 on the front redistribution layer 702 may be realized by, for example, ball grid array (BGA) solder bumping, which is a type of surface-mount packaging. FIG. 9 is a sectional view illustrating the exemplary semiconductor device using the exemplary semiconductor package in accordance with some embodiments. As shown in FIG. 9, the semiconductor package 700 is debonded from the carrier 102. The insulator layer 106 and the temporary bonding layer 104 of the semiconductor package 700 are opened. The semiconductor package 700 is flipped upside down and connected to a printed circuit board 914.

In the embodiment, the semiconductor package 902 includes two stacked mobile DDRs (or LPDDR) 904, 905 and a packaging substrate 903. The packaging substrate 903 includes a redistribution layer (not shown) similar to the abovementioned, and connects to the two mobile DDRs 904, 905 through bonding wires 906. Metal bumps 910 provide electrical connection between the backside redistribution layer 108 and the packaging substrate 903. Therefore, the semiconductor package 902 is bonded to the backside redistribution layer of the semiconductor packages 700, so that a package-on-package structure 900 including the semiconductor packages 700, 902 is provided.

Figure 10:
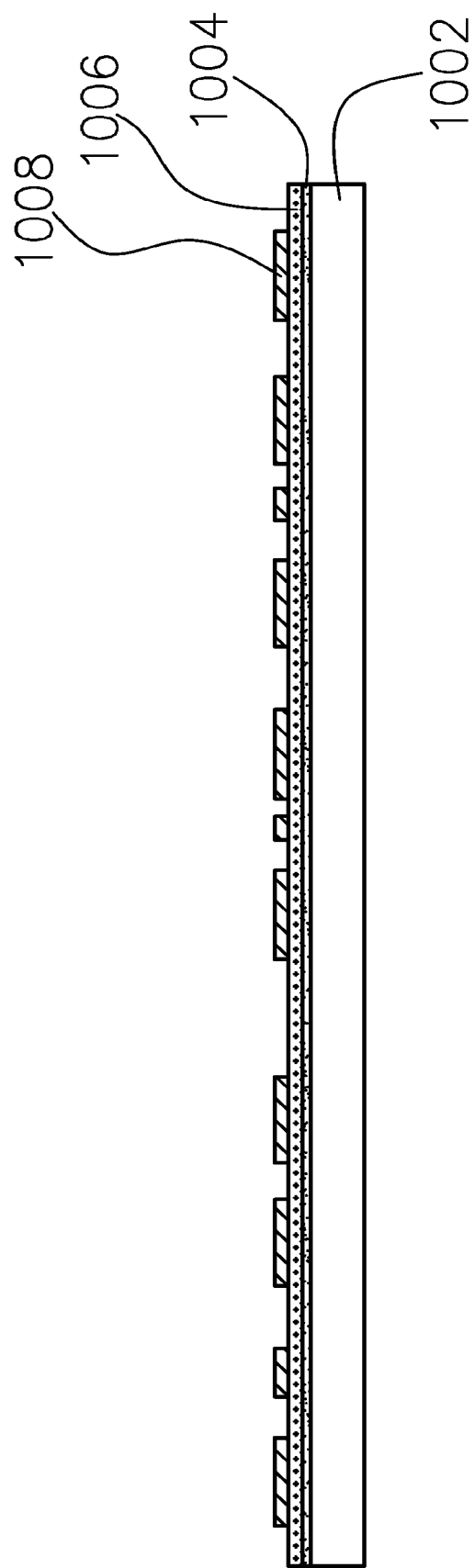

FIG. 10 is a sectional view illustrating an exemplary semiconductor package in accordance with some embodiments. As shown in FIG. 10, a temporary bonding layer 1004 is coated over a carrier 1002. The carrier 1002 may be formed of, for example, metal or glass. The temporary bonding layer 1004 is formed of, for example, glue.

A first insulator layer 1006 is formed over the temporary bonding layer 1004. The first insulator layer 1006 may be formed of, for example, epoxy or polymer. A backside redistribution layer 1008 is formed over the first insulator layer 1006, then, the backside redistribution layer 1008 is patterned by using a mask (not shown). The material for the backside redistribution layer 1008 may comprise, but is not limited to, for example Cu, Al, AlCu, Al alloy, Cu alloy, or other conductive materials.

Figure 11:
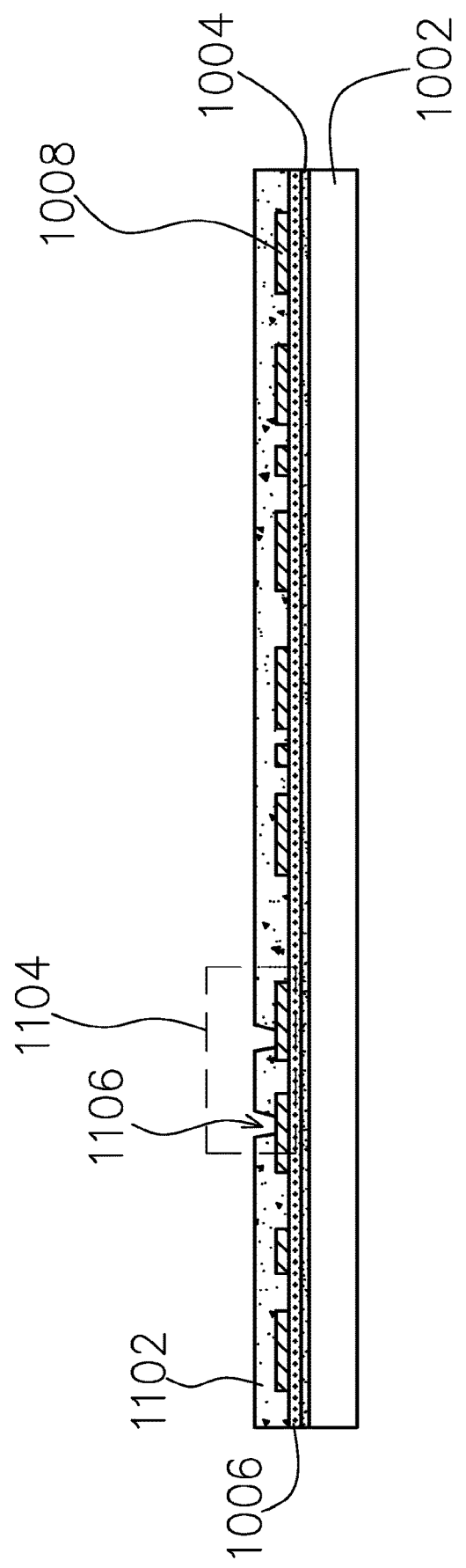
FIGS. 11-19 are sectional views illustrating the exemplary semiconductor package in accordance with some embodiments.

FIG. 11 is a sectional view illustrating the exemplary semiconductor package in accordance with some embodiments. As shown in FIG. 11, a second insulator layer 1102 is formed over the backside redistribution layer 1008 and the first insulator layer 1006. Then the second insulator layer 1102 is patterned to form a recess 1106 exposing a portion of the backside redistribution layer 1008. The second insulator layer 1102 may be formed of, for example, epoxy or polymer. A detail portion 1104 for solder wetting will be described.

Figure 12:
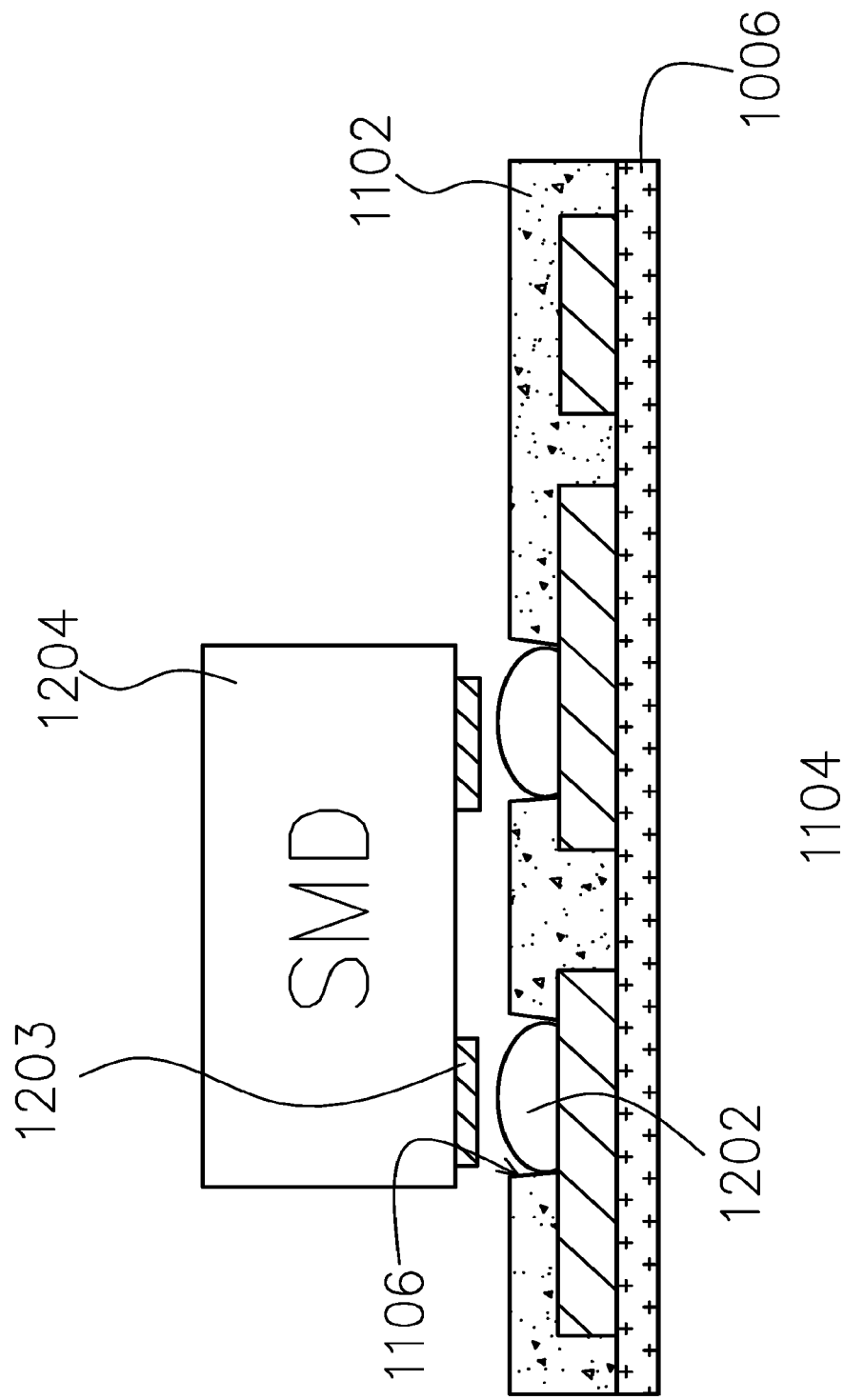

FIG. 12 is a sectional view illustrating detail portion 1104 of the exemplary semiconductor package in accordance with some embodiments. As shown in FIG. 12, a pre-solder 1202 is provided in the recess 1106 of the second insulator layer 1102. Another pre-solder 1203 is attached to the SMD component 1204.

Figure 13:
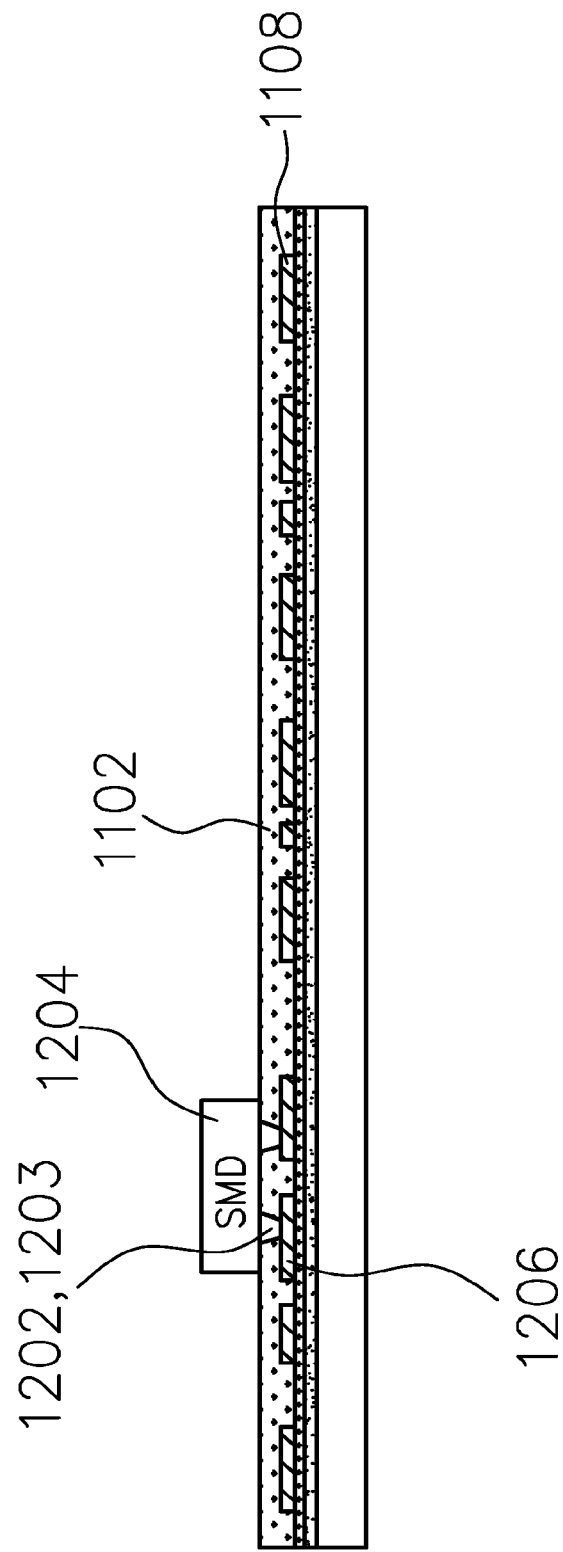

FIG. 13 is a sectional view illustrating the exemplary semiconductor package in accordance with some embodiments. As shown in FIG. 13, the pre-solders 1202, 1203 are combined to produce a solder joint and disposed between the SMD component 1204 and the portion 1206 of the backside redistribution layer 1008, so the SMD component 1204 contacts with the pre-solders 1202, 1203 in the recess of the second insulator layer 1102. The SMD component 1204 may be passive components, such as resistor, inductors or capacitors.

Figure 14:
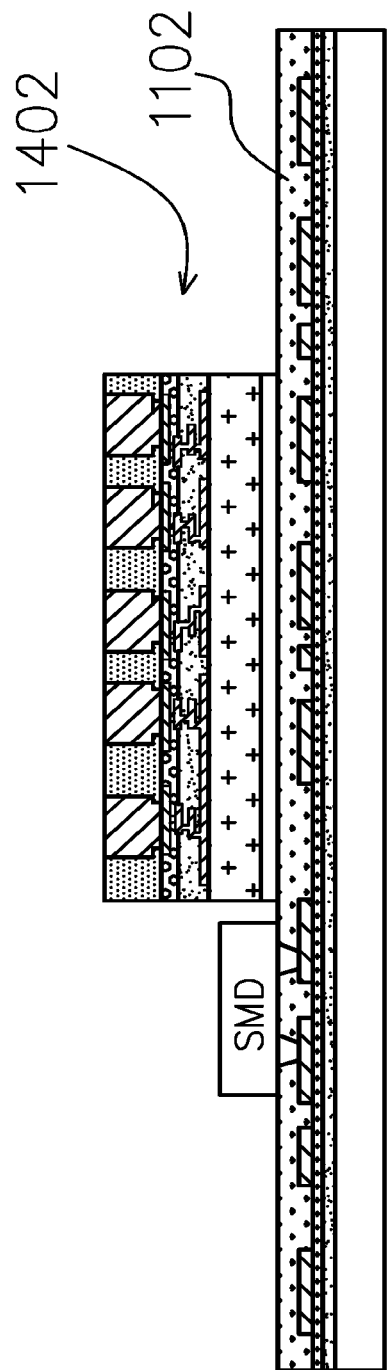

FIG. 14 is a sectional view illustrating the exemplary semiconductor package in accordance with some embodiments. As shown in FIG. 14, a chip 1402 is provided over the second insulator layer 1102. The chip 1402 may be selected from the group consisting of silicon semiconductors or III-V semiconductors. The chips may include a microelectromechanical system (MEMS).

Figure 15:
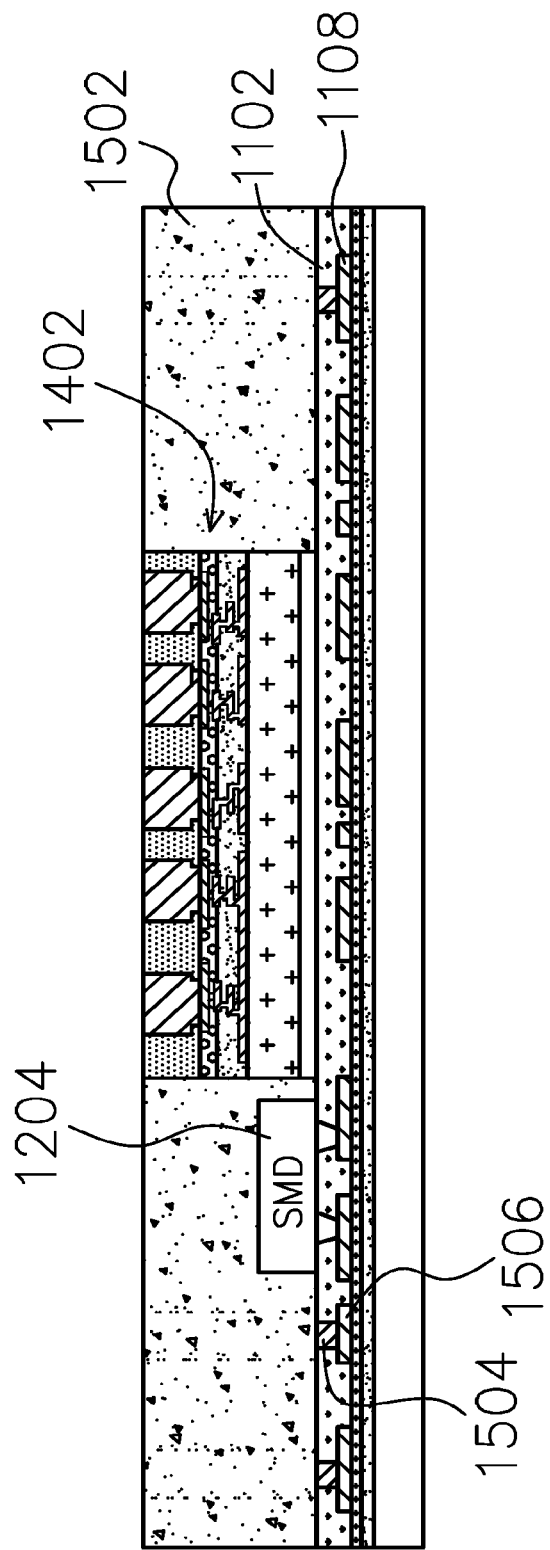

FIG. 15 is a sectional view illustrating the exemplary semiconductor package in accordance with some embodiments. As shown in FIG. 15, a molding compound 1502 is provided over the SMD component 1204 and adjacent to the chip 1402. The molding compound 1502 may be made of silica, organic materials, or epoxy resins. The molding step may be performed to form the molding compound 1502 surrounding the SMD component 1204 and adjacent to the chip 1402. The molding compound 1502 may be partially removed from the top of the chip 1402 to expose the upper surface of the chip 1402.

Before providing the molding compound 1502, a portion of the second insulator layer 1102 is removed to form a recess and to expose a portion 1506 of the backside redistribution layer 1008, and a conductive material 1504 is filled in the recess for further electrical connection.

Figure 16:
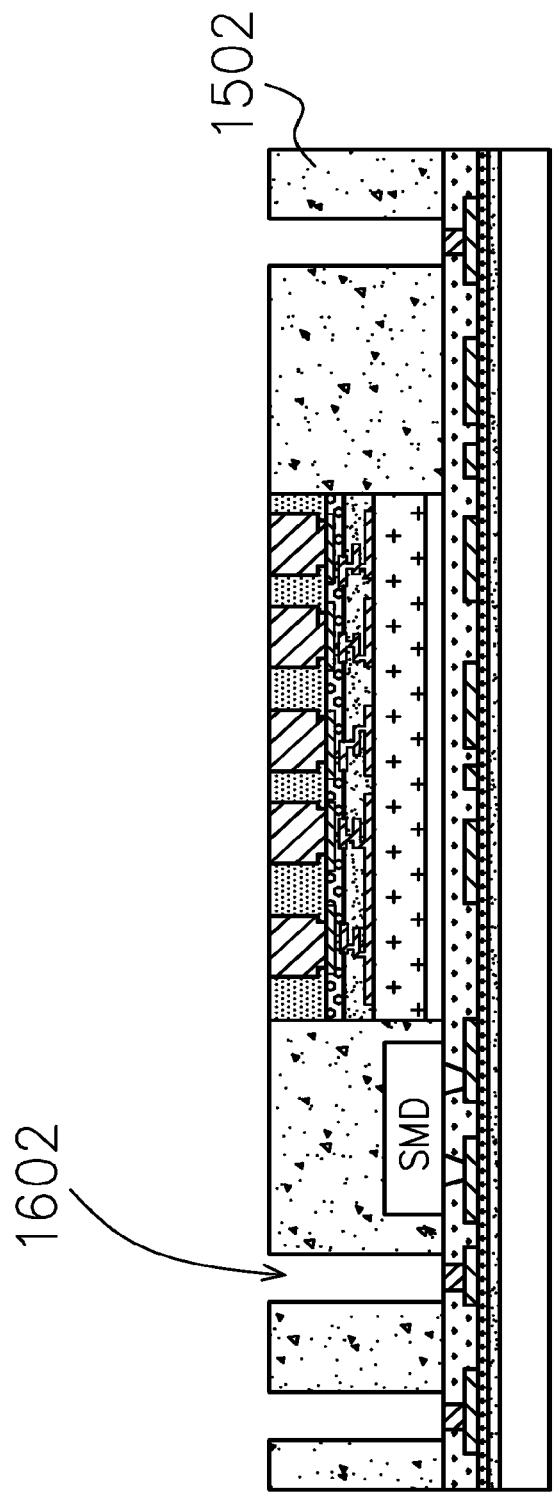

FIG. 16 is a sectional view illustrating the exemplary semiconductor package in accordance with some embodiments. As shown in FIG. 16, a via hole 1602 is opened in the molding compound 1502.

Figure 17:
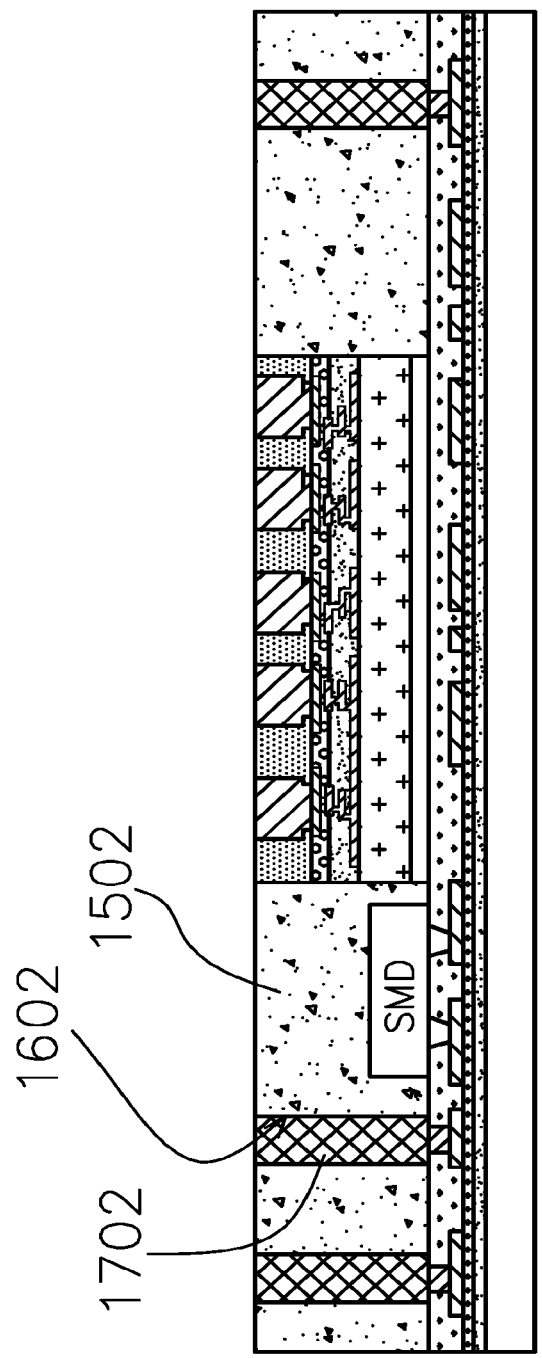

FIG. 17 is a sectional view illustrating the exemplary semiconductor package in accordance with some embodiments. As shown in FIG. 17, a via 1702 is provided in the via hole 1602 of the molding compound 1502.

Figure 18:
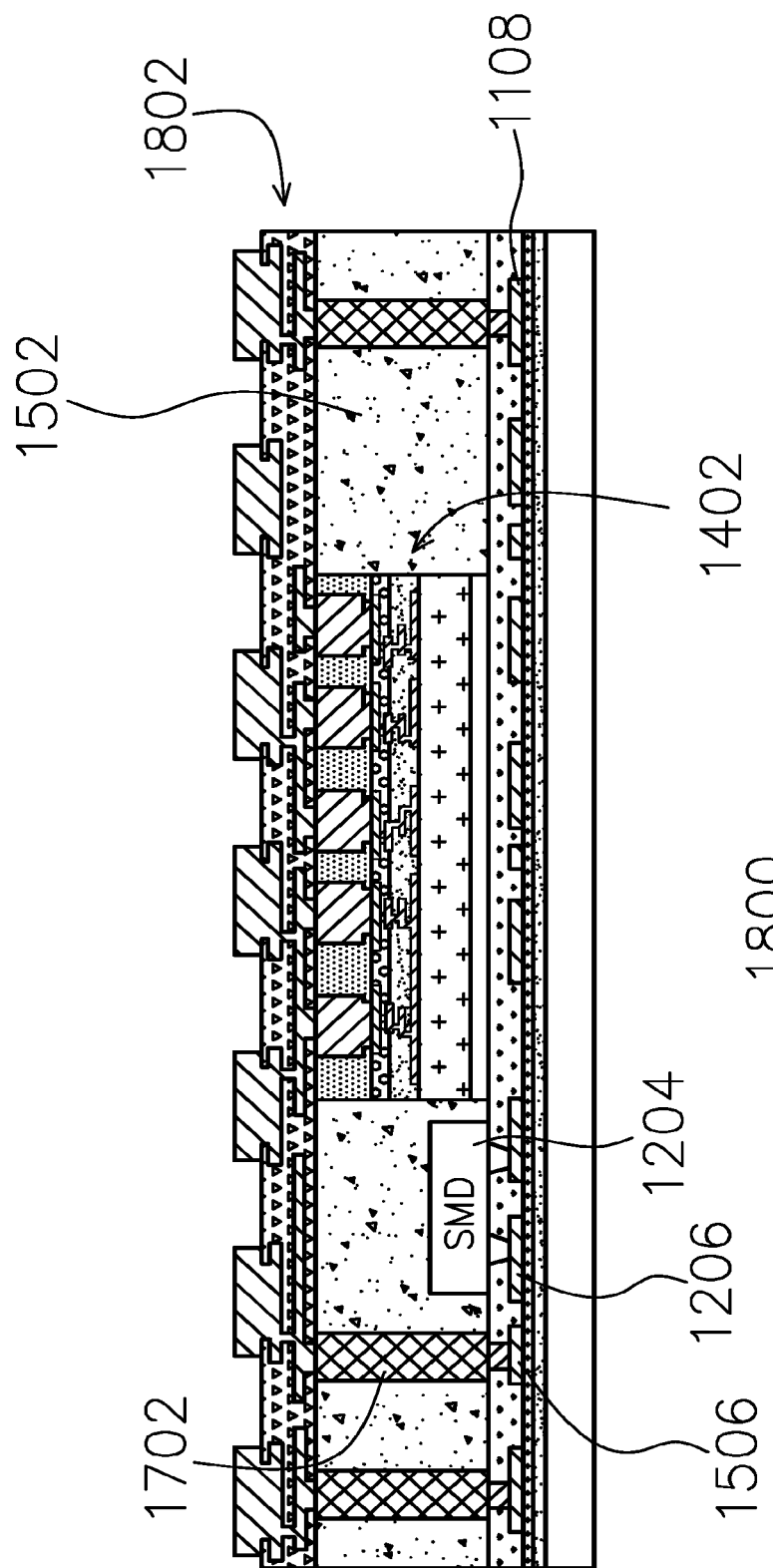

FIG. 18 is a sectional view illustrating the exemplary semiconductor package in accordance with some embodiments. As shown in FIG. 18, the portion 1206 and the portion of 1506 of the backside redistribution layer 1108 are connected, then a front redistribution layer 1802 is provided over the chip 1402 and the via 1702 to connect the chip 1402 and the SMD component 1204 by using the backside redistribution layer 1108, the via 1702, and the front redistribution layer 1802. The material for the front redistribution layer 1802 may comprise, but is not limited to, for example Cu, Al, AlCu, Al alloy, Cu alloy, or other conductive materials. As such, a semiconductor package 1800 is provided.

The SMD components 1204 are placed in the molding compound 1502 and are not placed between BGA balls. So the SMD components 1204 are no longer constrained by a height which is less than the stand-off-height of the BGA balls. While having a thinner package form factor without sacrificing signal integrity, the design margin for placement of the SMD components 1204 relaxes.

Figure 19:
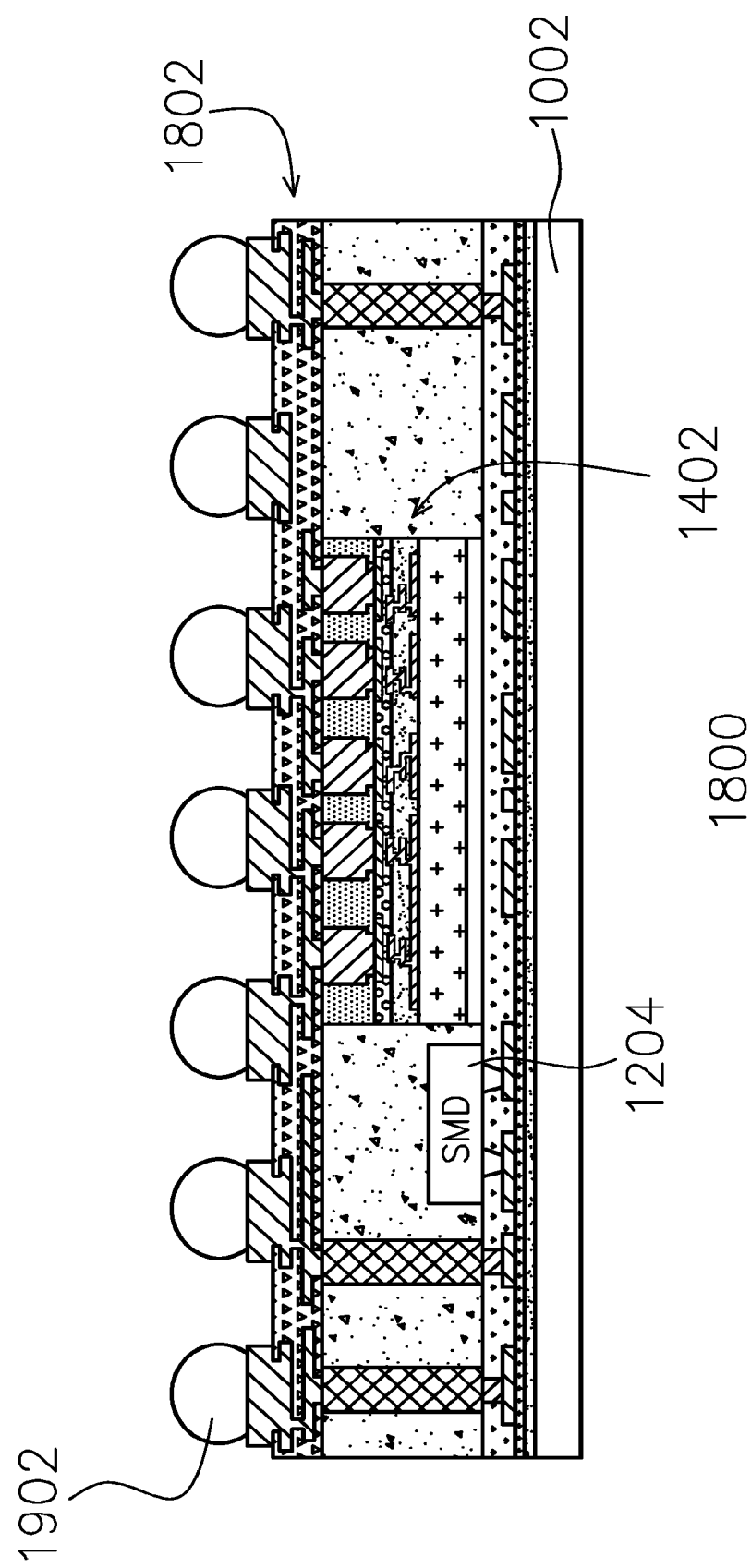

FIG. 19 is a sectional view illustrating the exemplary semiconductor package in accordance with some embodiments. As shown in FIG. 19, a plurality of metal bumps 1902 are provided and connected to the chip 1402 and the SMD component 1204 by the front redistribution layer 1802. Furthermore, the semiconductor package 1800 is debonded from the carrier 1002. The semiconductor package 1800 may be provided over and connected to a printed circuit board (not shown).

In the embodiment, the sequence of the processes abovementioned provides an example and does not limit scope of the disclosure. There are other possibilities to realize the semiconductor package and the method of forming the same, such as an alternative sequence which fabricates the via 1702 prior to the molding compound 1502.

FIGS. 20(a), 20(b) are top views illustrating the shape of the pad in the backside redistribution layer of the exemplary semiconductor package and its contact with the SMD component by using solders in accordance with some embodiments. As shown in FIG. 20(a), a pad 2002 with a notch 2003 is provided in the backside redistribution layer. The notch 2003 is designed to define location of the pad 2002. The width of the pad 2002 is about 450 micrometers; the length of the pad 2002 is about 400 micrometers. The width and the length of the notch 2003 are about 2-10 micrometers. As shown in FIG. 20(b), a pre-solder 2006 is placed over the pad 2002 for joining the pad 2002 and an SMD component 2004. The pre-solder 2006 is confined by the notch 2003.

FIGS. 21(a), 21(b) are top views illustrating the shape of the pad in the backside redistribution layer of the exemplary semiconductor package and its contact with the SMD component by using solders in accordance with some embodiments. As shown in FIG. 21(a), a pad 2102 with a slot 2103 is provided in the backside redistribution layer. The slot 2103 is designed to define location of the pad 2102. The width of the pad 2102 is about 450 micrometers; the length of the pad 2102 is about 400 micrometers. The width of the slot 2103 is about 30-60 micrometers; the length of the slot 2103 is about 20 micrometers. The number of the slots is not limited and varies based on pad designs. As shown in FIG. 21(b), a pre-solder 2106 is placed over the pad 2102 for joining the pad 2102 and an SMD component 2104. The pre-solder 2106 is confined by the slot 2103. Additionally, different shapes of the slots can be applied for stopping solder wetting expansion.

Figure 22A:
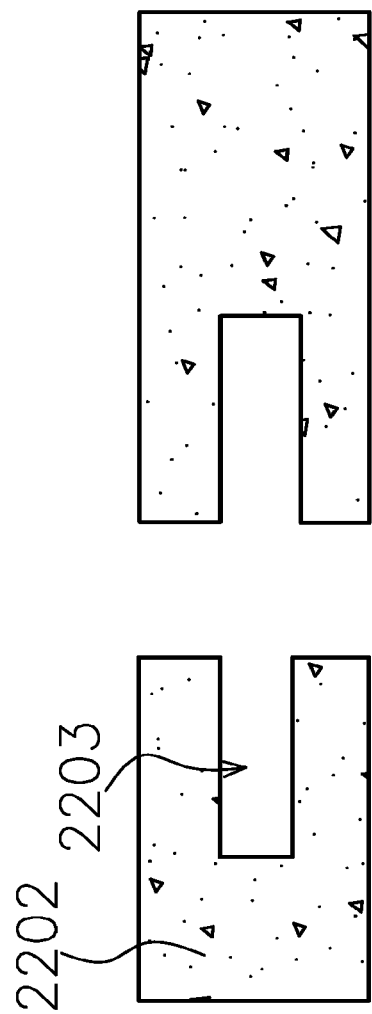
FIGS. 22(a), 22(b) are top views illustrating the shape of the pad in the backside redistribution layer of the exemplary semiconductor package and its contact with the SMD component by using solders in accordance with some embodiments.
Figure 22B:
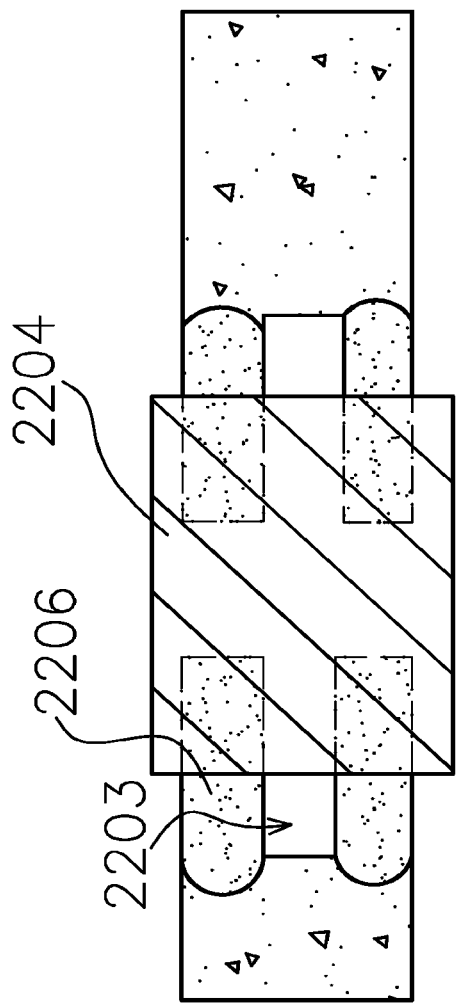

FIGS. 22(a), 22(b) are top views illustrating the shape of the pad in the backside redistribution layer of the exemplary semiconductor package and its contact with the SMD component by using solders in accordance with some embodiments. As shown in FIG. 22(a), a u-shape pad 2202 with a open structure 2203 is provided in the backside redistribution layer. The open structure 2203 is designed to define location of the u-shape pad 2202. The width of the open structure 2203 is about 450 micrometers; the length of the open structure 2203 is about 50 micrometers. As shown in FIG. 22(b), a pre-solder 2206 is placed over the u-shape pad 2202 to join the u-shape pad 2202 and an SMD component 2204. By using the open structure 2203, the molding material can flow into the space under the SMD component 2204.

FIGS. 23, 24 are top views illustrating the shape of the pad in the backside redistribution layer of the exemplary semiconductor package in accordance with some embodiments. In order to stop solder wetting expand, different shapes and combinations of the slots can be applied, such as a pad 2302 having three aligned slots in FIG. 23, and even a pad 2402 having four slots in FIG. 24.

Figure 25:
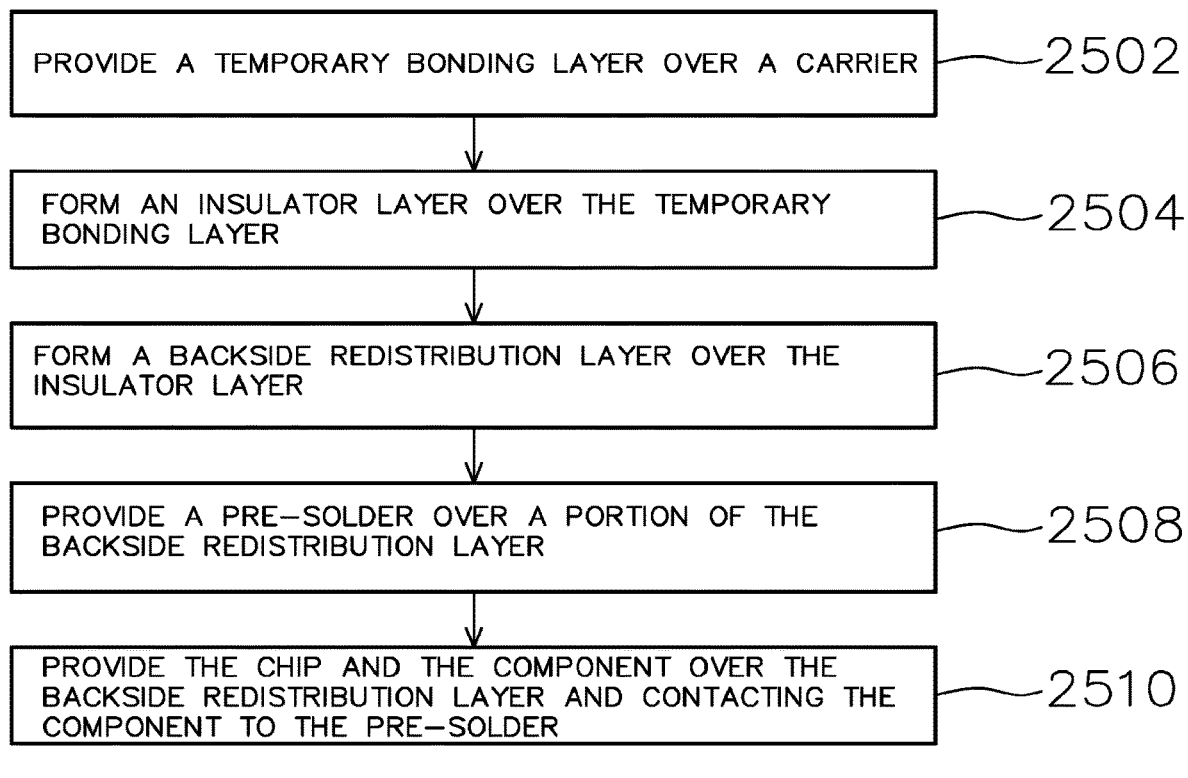
FIG. 25 is a flow chart for a method of forming a semiconductor package comprising a chip and a component in accordance with some embodiments.

FIG. 25 is a flow chart for a method of forming a semiconductor package comprising a chip and a component in accordance with some embodiments. As shown in FIG. 25, a method 2500 is provided. The method 2500 includes the following operations: providing a temporary bonding layer over a carrier (2502); forming an insulator layer over the temporary bonding layer (2504); forming a backside redistribution layer over the insulator layer (2506); providing a pre-solder over a portion of the backside redistribution layer (2508); providing the chip and the component over the backside redistribution layer and contacting the component to the pre-solder (2510).

The operation 2506 further includes forming a pad having a notch in the backside redistribution layer. The operation 2506 further includes forming a pad having a slot in the backside redistribution layer. The operation 2506 further includes forming a u-shape pad having a open structure in the backside redistribution layer. The method 2500 further includes providing a plurality of metal bumps connected to the chip and the component by the front redistribution layer. The method 2500 further includes: providing a molding compound over the component and adjacent to the chip; opening a via hole in the molding compound; providing a via in the via hole of the molding compound; and providing a front redistribution layer over the chip and the via to connect the chip and the component by using the backside redistribution layer, the via and the front redistribution layer; debonding the semiconductor package from the carrier; and providing the semiconductor package over and connected to a printed circuit board. The operation 2510 further includes providing a surface-mount device (SMD) over the backside redistribution layer. The operation 2504 further includes forming the insulator layer made of polymer over the temporary bonding.

Figure 26:
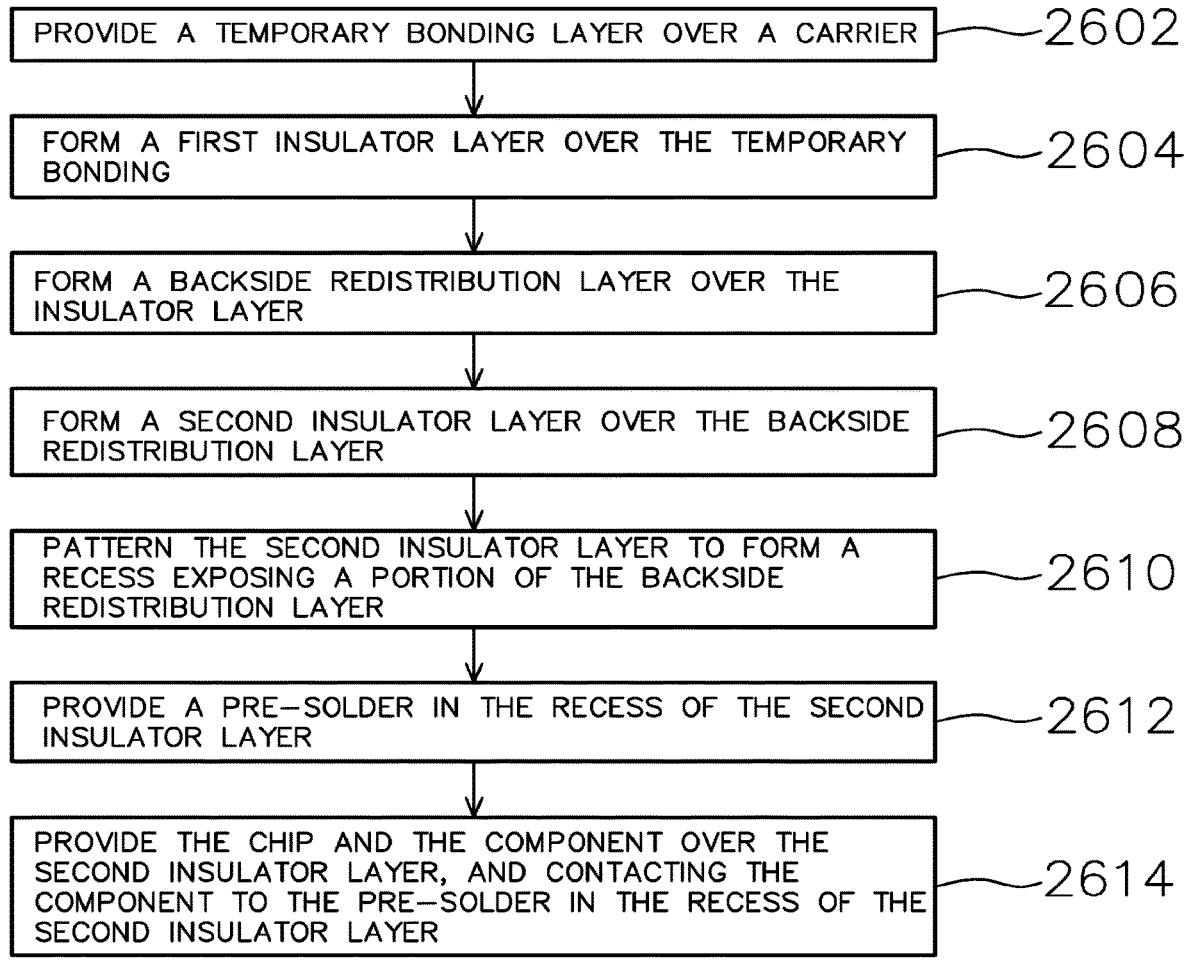
FIG. 26 is a flow chart for a method of forming a semiconductor package comprising a chip and a component in accordance with some embodiments.

FIG. 26 is a flow chart for a method of forming a semiconductor package comprising a chip and a component in accordance with some embodiments. As shown in FIG. 26, a method 2600 is provided. The method 2600 includes the following operations: providing a temporary bonding layer over a carrier (2602); forming a first insulator layer over the temporary bonding (2604); forming a backside redistribution layer over the insulator layer (2606); forming a second insulator layer over the backside redistribution layer (2608); patterning the second insulator layer to form a recess exposing a portion of the backside redistribution layer (2610); providing a pre-solder in the recess of the second insulator layer (2612); providing the chip and the component over the second insulator layer, and contacting the component to the pre-solder in the recess of the second insulator layer (2614).

The operation 2606 further includes forming a pad having a notch in the backside redistribution layer. The operation 2606 further includes forming a pad having a slot in the backside redistribution layer. The operation 2606 further includes forming a u-shape pad having a open structure in the backside redistribution layer. The method 2600 further includes providing a plurality of metal bumps connected to the chip and the component by the front redistribution layer. The method 2600 further includes: providing a molding compound over the component and adjacent to the chip; opening a via hole in the molding compound and the second insulator layer; providing a via in the via hole of the molding compound and the second insulator layer; and providing a front redistribution layer over the chip and the via to connect the chip and the component by using the backside redistribution layer, the via and the front redistribution layer; debonding the semiconductor package from the carrier; and providing the semiconductor package over and connected to a printed circuit board. The operation 2614 further includes providing a surface-mount device (SMD) over the second insulator layer.

According to an exemplary embodiment, a method of forming a semiconductor package comprises: receiving a carrier; coating the carrier with a bonding layer; forming a first insulator layer over the bonding layer; forming a backside redistribution layer over the first insulator layer; forming a second insulator layer over the backside redistribution layer; patterning the second insulator layer to form a recess that extends through the second insulator layer and to the backside redistribution layer; filling the recess with a solder; and coupling a surface-mount device (SMD) to the solder.

According to an exemplary embodiment, a semiconductor package comprises: a first insulator layer; a backside redistribution layer over the first insulator layer; a second insulator layer over the backside redistribution layer; a surface-mount device (SMD) over the second insulator layer; and a solder extending through the second insulator layer and coupled to the backside redistribution layer and the SMD.

According to an exemplary embodiment, a semiconductor package comprises a backside redistribution layer, a surface-mount device (SMD), a pad between the backside redistribution layer and the SMD, and a solder joining the backside redistribution layer, the SMD, and the pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
   a carrier coated with a bonding layer;
   a first insulator layer formed over and above the bonding layer;
   a backside redistribution layer formed over and above the first insulator layer;
   a second insulator layer formed over the backside redistribution layer;
   a recess comprising a solder, the recess formed by patterning the second insulator layer, the recess extending through the second insulator layer and to the backside redistribution layer;

a surface-mount device (SMD) coupled to the solder; and at least one pad each having a notch formed in the backside redistribution layer, wherein the notch interrupts a laterally-extending end edge of the pad by extending longitudinally inward from the laterally-extending end edge, wherein the notch has an open end at the laterally-extending end edge of the pad and a closed end longitudinally opposite the open end, and is located between a first side edge and a second side edge of the pad to form (i) a first tab bounded by a first side of the notch and the end edge and the first side edge and (ii) a second tab bounded by a second side of the notch and the end edge, wherein the at least one pad comprises first and second pads that connect the SMD to the backside redistribution layer and are spaced apart from each other in a longitudinal direction, wherein the SMD covers only one of the first tab or the second tab from each of the first and second pads.

2. The semiconductor packaging of claim 1, further comprising:

a molding compound formed over the SMD, wherein a ball grid array is configured to connect to the SMD and formed over the molding compound, wherein the SMD is embedded in the molding compound while the ball grid array is formed outside the molding compound; and first and second solders that are electrically connected to each other only through the pad and that respectively join the first and second tabs to the SMD.

3. The semiconductor packaging of claim 2, further comprising a chip adjacent the molding compound and the backside redistribution layer.

4. The semiconductor packaging of claim 3, further comprising a front redistribution layer coupled to the top surface of the chip.

5. The semiconductor packaging of claim 4, further comprising:

a via hole that extends through the molding compound and the second insulator layer and to the backside redistribution layer; and a via material filled within the via hole, wherein the front redistribution layer is coupled to the via material.

6. The semiconductor packaging of claim 4, further comprising a plurality of metal bumps coupled to the front redistribution layer.

7. A semiconductor package comprising:

a carrier coated with a bonding layer;

a first insulator layer formed over and above the bonding layer;

a backside redistribution layer formed over and above the first insulator layer;

a second insulator layer formed over the backside redistribution layer;

a recess filled with solder, the recess formed by patterning the second insulator layer, the recess extending through the second insulator layer and to the backside redistribution layer;

a surface-mount device (SMD) coupled to the solder; and at least one pad each having a notch formed in the backside redistribution layer, wherein the notch interrupts a laterally-extending end edge of the pad by extending longitudinally inward from the laterally-extending end edge, wherein the notch has an open end at the laterally-extending end edge of the pad and a closed end longitudinally opposite the open end, and is located between a first side edge and a second side edge of the pad to form (i) a first tab bounded by a first side of the notch and the end edge and the first side edge and (ii) a second tab bounded by a second side of the notch and the end edge, wherein the at least one pad comprises first and second pads that connect the SMD to the backside redistribution layer and are spaced apart from each other in a longitudinal direction, wherein the SMD covers only one of the first tab or the second tab from each of the first and second pads.

8. The semiconductor package of claim 7, further comprising:

a molding compound formed over the SMD, wherein a ball grid array is configured to connect to the SMD and formed over the molding compound, wherein the SMD is embedded in the molding compound while the ball grid array is formed outside the molding compound; and first and second solders that are electrically connected to each other only through the pad and that respectively join the first and second tabs to the SMD.

9. The semiconductor package of claim 8, further comprising a chip adjacent the molding compound and the backside redistribution layer, wherein the molding compound is formed over the chip.

10. The semiconductor package claim 9, further comprising a front redistribution layer coupled to the top surface of the chip.

11. The semiconductor package of claim 10, further comprising:

a via hole that extends through the molding compound and the second insulator layer and to the backside redistribution layer; and wherein the via hole is filled with a via material and the front redistribution layer is coupled to the via material.

12. The semiconductor package of claim 10, further comprising a plurality of metal bumps coupled to the front redistribution layer.

13. The semiconductor package of claim 7, further comprising a plurality of metal bumps extending through the first insulator layer and coupled to the backside redistribution layer.

14. A semiconductor package comprising:

a temporary bonding layer over a carrier;

a first insulator layer formed over and above the temporary bonding;

a backside redistribution layer formed over and above the insulator layer;

a second insulator layer formed over the backside redistribution layer, wherein the second insulator layer is patterned to form a recess exposing a portion of the backside redistribution layer;

a pre-solder formed in the recess of the second insulator layer;

a chip and component formed over the second insulator layer, the component contacting the pre-solder in the recess of the second insulator layer; and at least one pad each having a notch formed in the backside redistribution layer, wherein the notch interrupts a laterally-extending end edge of the pad by extending longitudinally inward from the laterally-extending end edge, wherein the notch has an open end at the laterally-extending end edge of the pad and a closed end longitudinally opposite the open end, and is located between a first side edge and a second side edge of the pad to form (i) a first tab bounded by a first side of the notch and the end edge and the first side edge and (ii) a second tab bounded by a second side of the notch and the end edge, wherein the at least one pad comprises first and second pads that connect a surface-mount device (SMD) to the backside redistribution layer and are spaced apart from each other in a longitudinal direction, wherein the SMD covers only one of the first tab or the second tab from each of the first and second pads.

15. The semiconductor package of claim 14, further comprising:
a molding compound provided over the component and adjacent to the chip;
a via hole in the molding compound and the second insulator layer;
a via within the via hole of the molding compound and the second insulator layer; and
a front redistribution layer formed over the chip and the via, connecting the chip and the component using the backside redistribution layer, the via, and the front redistribution layer.

16. The semiconductor package of claim 15, wherein a pad having a slot is formed in the backside redistribution layer.

17. The semiconductor package of claim 15, wherein a u-shape pad is formed having a open structure in the backside redistribution layer.

18. The semiconductor package of claim 15, wherein a plurality of metal bumps are connected to the chip and the component by the front redistribution layer.

19. The semiconductor of claim 14, wherein a surface-mount device (SMD) is formed over the second insulator layer.

20. The semiconductor of claim 14, further comprising:
first and second solders that are electrically connected to each other only through the pad and that respectively join the first and second tabs to the SMD, wherein the SMD covers only a portion of the first tabs and only a portion of the second tabs and does not directly over the notch's closed end.

* * * * *